(12) United States Patent
Yanagi et al.

(10) Patent No.: US 12,038,468 B2
(45) Date of Patent: *Jul. 16, 2024

(54) METHOD FOR MEASURING CURRENT-VOLTAGE CHARACTERISTIC

(71) Applicant: Rohm Co., Ltd., Kyoto (JP)

(72) Inventors: Tatsuya Yanagi, Kyoto (JP); Hirotaka Otake, Kyoto (JP); Hiroyuki Sakairi, Kyoto (JP); Naotaka Kuroda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 674 days.

This patent is subject to a terminal disclaimer.

(21) Appl. No.: 17/139,228

(22) Filed: Dec. 31, 2020

(65) Prior Publication Data

US 2021/0132136 A1  May 6, 2021

Related U.S. Application Data

(63) Continuation of application No. 15/906,233, filed on Feb. 27, 2018, now Pat. No. 10,901,024, which is a
(Continued)

(30) Foreign Application Priority Data

Mar. 29, 2016 (JP) .................................. 2016065893

(51) Int. Cl.
*G01R 31/26* (2020.01)
*G06F 30/367* (2020.01)

(52) U.S. Cl.
CPC ..... *G01R 31/2601* (2013.01); *G01R 31/2603* (2013.01); *G01R 31/2621* (2013.01); *G06F 30/367* (2020.01)

(58) Field of Classification Search
CPC ............ G01R 31/2601; G01R 31/2603; G01R 31/2621; G06F 30/367
(Continued)

(56) References Cited

U.S. PATENT DOCUMENTS

2007/0040571 A1   2/2007 Dolian
2009/0256827 A1  10/2009 Tanikame
(Continued)

FOREIGN PATENT DOCUMENTS

JP   05-203698   8/1993
JP   2004-119633  4/2004
(Continued)

OTHER PUBLICATIONS

Vishay_2015 (Power MOSFET Basics: Understanding the Turn-On Process, Jun. 23, 2015 Doc. No. 68214 Application Note AN850). (Year: 2015).*
(Continued)

*Primary Examiner* — Brian S Cook
(74) *Attorney, Agent, or Firm* — Fish & Richardson P.C.

(57) ABSTRACT

A method for measuring a current-voltage characteristic (Id-Vds characteristic) representing the relationship between the drain current Id (or collector current) and the drain-source voltage Vds (or collector-emitter voltage) of a transistor M1 includes setting the drain current Id (or collector current) and the drain-source voltage Vds (or collector-emitter voltage), measuring the gate-source voltage Vgs (or gate-emitter voltage) and the gate current Ig of the transistor M1 in a switching transient state, and acquiring the current-voltage characteristic (Id-Vds characteristic) of the transistor M1 based on the measurement results of the gate-source voltage Vgs (or gate-emitter voltage) and the gate current Ig.

21 Claims, 8 Drawing Sheets

Related U.S. Application Data continuation of application No. 15/473,114, filed on Mar. 29, 2017, now Pat. No. 10,908,204, application No. 17/139,228 is a continuation of application No. 15/473,114, filed on Mar. 29, 2017, now Pat. No. 10,908,204.

(58) Field of Classification Search
USPC .......................................................... 704/14
See application file for complete search history.

(56) References Cited

U.S. PATENT DOCUMENTS

| | | |
|---|---|---|
| 2013/0257697 A1 | 10/2013 | Tanikame |
| 2014/0232761 A1 | 8/2014 | Tanikame |
| 2014/0362060 A1 | 12/2014 | Tanikame |
| 2015/0279275 A1 | 10/2015 | Tanikame |
| 2016/0225320 A1 | 8/2016 | Tanikame |
| 2017/0285095 A1 | 10/2017 | Yanagi et al. |
| 2018/0188312 A1 | 7/2018 | Yanagi et al. |

FOREIGN PATENT DOCUMENTS

| | | | |
|---|---|---|---|
| JP | 2009-258275 | | 11/2009 |
| JP | 2010-002202 | | 1/2010 |
| JP | 2010-002202 | * | 7/2010 |
| JP | 2010-211387 | | 9/2010 |
| JP | 2015-161627 | | 9/2015 |

OTHER PUBLICATIONS

Vishay_2016 (Power MOSFET Basics: Understanding Gate Charge and Using it to Assess Switching Performance, Feb. 16, 2016) ( Year: 2016).*

Longo_2012 (AN4191 Application Note Power MOSFET: Rg impact on applications, 2012) (Year: 2012).*

Hermwille_2007 (Application Note AN-7003 Gate Resistor—Principles and Applications) (Year: 2007).*

Chen_2009 (Characterization and Modeling of 1.2 kV, 20 A SiC MOSFETS, 2009 IEEE) (Year: 2009).*

Davis_2013 (GaN Basics: FAQ, Oct. 2, 2013 Electronic Design). (Year: 2013).*

Aaen et al., "Modeling and Characterization of RF and Microwave Power FETs," Cambridge University Press, Jun. 25, 2007, pp. 275 & 282.

Berning, "A Reverse-Bias Safe Operating Area Transistor Tester", Semiconductor Measurement Technology, U.S. Department of Commerce, National Bureau of Standards, 1979, 48 pages.

Blake et al., "IGBTs of MOSFETs: Which is Better for your Design?" Electronic Design, Oct. 1999, 8 pages.

Chen, Zheng, et al., "Characterization and Modeling of 1.2 kV, 20 A SiC MOSFETs," Proc. IEEE Energy Conversion Congress and Exposition (ECCE), pp. 1480-1487 (2009).

Hermwille, "Gate Resistor—Principles and Applications," SEMIKRON, pp. 1-10 (2007).

Longo et al., "AN4191 Application Note—Power MOSFET:Rg impact on applications," STMicroelectronics, Nov. 2012, 20 pages.

[No. Author], "MTP10N10E—Power MOSFET 10 Amps, 100 Volts N-Channel TO-220," MTP10N10E-D-2006, On Semiconductor, Aug. 2006—Rev. 2, 2006, 8 pages.

Mukunoki, Y., et al., "Precise Simulation Technology for Transient Properites of SiC-MOSFETs with New Device Model," Mitsubishi Electric Giho 91:7 pp. 27 (393)-30(396) (Jul. 2017) (with partial English-language translation).

Office Action for corresponding Japanese Patent Application No. 2016-065893 mailed on Oct. 3, 2017 (with English Translation).

Sakairi, H., et al., "Sic-FET Chip Model to Simulate Its Switching Behaviors in High Voltage and Current Region," The $29^{th}$ Workshop on Circuits and Systems in Kitakyushy pp. 285-290 (2016) (with partial English-language translation).

USPTO Final Office Action mailed in corresponding U.S. Appl. No. 15/473,114 (Aug. 6, 2020).

USPTO, Final Office Action mailed in U.S. Appl. No. 15/473,114 (Sep. 6, 2018).

USPTO, Official communication mailed in U.S. Appl. No. 15/473,114 (Feb. 4, 2019).

USPTO; Non-Final Office Action mailed in corresponding U.S. Appl. No. 15/906,233 (Oct. 25, 2019).

USPTO; Office Action mailed in U.S. Appl. No. 15/473,114 (Apr. 23, 2018).

Vishay 2016 (Power MOSFET Basics: Understanding Gate Charge and Using it to Assess Switching Performance, Feb. 16, 2016). (Year: 2016), 6 pages.

Yanagi, T., et al., "Measurement Scheme to Model an SiC MOSFET for Simulating Its Switching Behaviors," PCIM Europe pp. 811-815 (2017).

Zesla 2011 (Inductor as a current source, downloaded from https://www.electro-tech-online.conn/threads/inductor-as-a-current-source .118715/ May 2011). (Year: 2011), 9 pages.

* cited by examiner

METHOD FOR MEASURING CURRENT-VOLTAGE CHARACTERISTIC

CROSS-REFERENCE TO RELATED APPLICATIONS

This application is a continuation of U.S. application Ser. No. 15/906,233, filed Feb. 27, 2018, and also is a continuation of U.S. patent application Ser. No. 15/473,114, filed Mar. 29, 2017. U.S. application Ser. No. 15/906,233, filed Feb. 27, 2018, is a continuation of U.S. patent application Ser. No. 15/473,114, filed Mar. 29, 2017, which claims the benefit of priority of Japanese Patent Application No. 2016-065893, filed on Mar. 29, 2016. The contents of the foregoing applications are incorporated by reference herein in their entirety.

BACKGROUND OF THE INVENTION

1. Field of the Invention

The present invention relates to a method for measuring a current-voltage characteristic.

2. Description of Related Art

To create a device model of a transistor used in computer simulations such as SPICE (simulation program with integrated circuit emphasis), it is essential to measure the current-voltage characteristic of the transistor (for example, the Id-Vds characteristic, that is, the relationship between the drain current Id and the drain-source voltage Vds of a MOSFET). The current-voltage characteristic is often measured by use of a curve tracer.

With a curve tracer, for example, while a predetermined gate-source voltage is applied to the transistor, the drain-source voltage is swept and meanwhile the drain current passing is measured; thereby the current-voltage characteristic of the transistor is acquired. Here, to measure the drain current at one point, as the drain-source voltage, a pulse needs to be applied for at least several tens of microseconds. Thus, a large amount of heat is produced under a high-current/high-voltage condition, and it is thus unrealistic to measure, with a curve tracer, a current-voltage characteristic of a power transistor used under such a condition.

FIG. 7 is a diagram of a current-voltage characteristic showing a measurement range of a curve tracer. Here, as to the current-voltage characteristic of the power transistor (for example, a SiC-MOSFET with a high withstand voltage (1200 V withstand voltage/80 A peak) as a measurement target, the solid lines indicate the part which can be measured by the curve tracer, and the broken lines indicate an example of the part which cannot be realistically measured by the curve tracer. Moreover, the dash-dot line in FIG. 7 represents a locus (load curve) showing the switching transient characteristic observed when an inductive load is connected to the power transistor.

As will be understood from FIG. 7, the operation range of the power transistor extends far beyond the measurement range of the curve tracer. The load curve of the power transistor represented by the dash-dot line in FIG. 7 has a maximum power point X where a high current and a high voltage are simultaneously applied, and it is difficult to measure this region by use of the curve tracer due to the power limit of the device and the heat produced by and destruction of the power transistor.

With a common Si-MOSFET or the like, in the saturation region (for example, the voltage region where the drain-source voltage is higher than the pinch-off point), the drain current remains substantially constant. Thus, as to the current-voltage characteristic in the saturation region, actual measurement can be omitted by assuming that the drain current remains constant irrespective of the drain-source voltage.

On the other hand, with a power transistor such as a SiC-MOSFET, due to a short-channel effect resulting from the length of the channel or the like, the gradient of the current-voltage characteristic does not become zero even in the saturation region (see the broken-line in FIG. 7). Thus, when the current-voltage characteristic of the SiC-MOSFET is acquired, if, as with the current-voltage characteristic of the Si-MOSFET, the drain current in the saturation region is assumed to remain constant, the acquired result greatly deviates from the actual current-voltage characteristic; this greatly affects the accuracy of the device model.

In view of the foregoing, to accurately create a device model of, in particular, a power transistor which is used under a high-current/high-voltage condition and of which the electrical characteristic in such a range is difficult to estimate, it is necessary to establish a new method for measuring a current-voltage characteristic with as low heat production as possible.

Conventionally, there has been proposed a method for acquiring a current-voltage characteristic of a power transistor without the use of a curve tracer. For example, in Non-Patent Document 1 (Z. Chen et al. "Characterization and Modeling of 1.2 kV, 20 A SiC FETs" in Proc. IEEE Energy Convers. Congr. Expo. (ECCE '09), pp. 1480-1487, September, 2009), current-voltage measurement is performed by use of switching measurement. Here, a method is proposed in which the voltage (corresponding to the gate-source voltage swept by a curve tracer) applied to the gate oxide film of a SiC-MOSFET is calculated from the rise time of the drain current, and by use of the calculated result, the current-voltage characteristic of the SiC-MOSFET is acquired.

However, according to the conventional method proposed in Non-Patent Document 1, the start and end points of the rise time of the drain current are not clearly defined; this tends to cause variations in the measurement result. Thus, there is still room for improvement in the aspect of measurement accuracy.

SUMMARY OF THE INVENTION

To cope with the above-mentioned problem encountered by the present inventors, the present invention aims to provide a method for measuring a current-voltage characteristic with low heat production and high accuracy.

According to one aspect of the present invention, a method for measuring a current-voltage characteristic representing the relationship between the drain current (or collector current) and the drain-source voltage (or collector-emitter voltage) of a transistor includes setting the drain current (or collector current) and the drain-source voltage (or collector-emitter voltage), measuring the gate-source voltage (or gate-emitter voltage) and the gate current of the transistor in a switching transient state, and acquiring the current-voltage characteristic of the transistor based on the measurement results of the gate-source voltage (or gate-emitter voltage) and the gate current.

Other features, elements, steps, benefits, and characteristics of the present invention will become clearer with reference to the following description of preferred embodiments thereof in conjunction with the accompanying drawings.

DETAILED DESCRIPTION OF PREFERRED EMBODIMENTS

Figure 1:
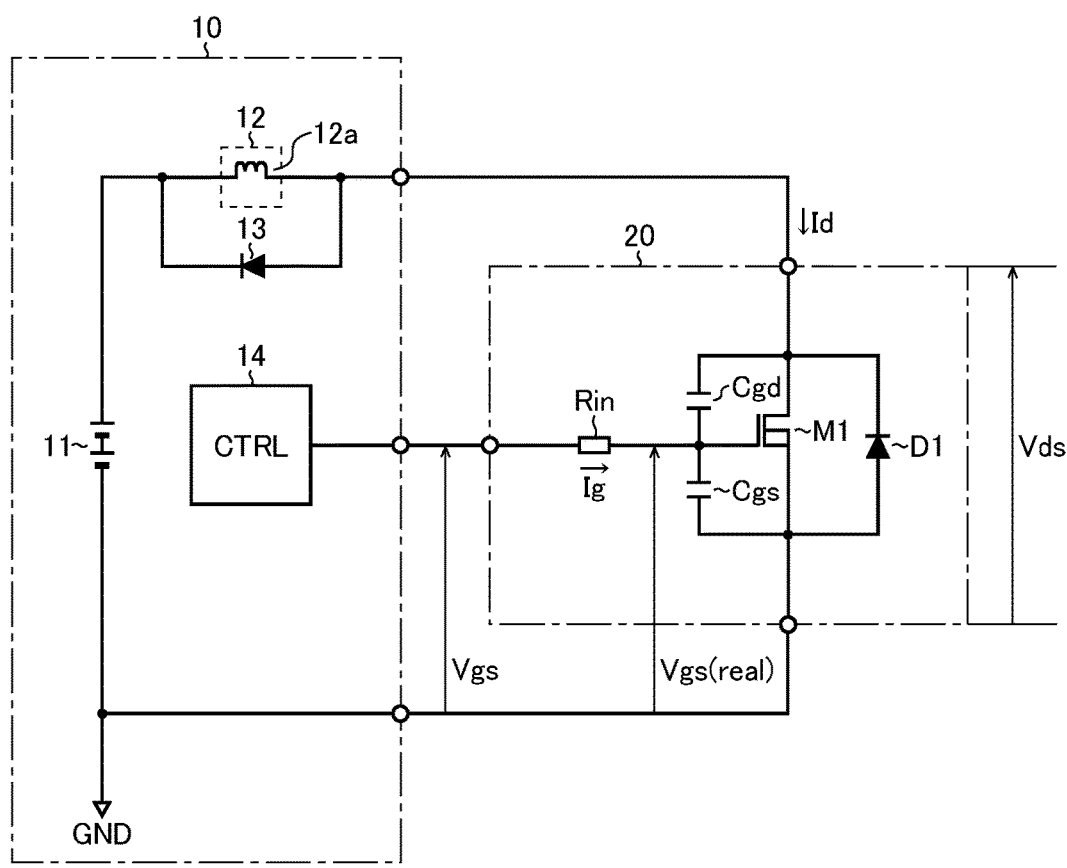
FIG. 1 is an equivalent circuit diagram showing a measurement device according to one embodiment.

Measurement Device: FIG. 1 is an equivalent circuit diagram showing a measurement device according to one embodiment that is used when a current-voltage characteristic of a switching device is measured. The measurement device 10 according to the embodiment includes a voltage source 11, a current source 12, a diode 13, and a controller 14, and measures the current-voltage characteristic of the switching device 20 (here, the Id-Vds characteristic, that is, the relationship between the drain current Id and the drain-source voltage Vds of the switching device 20).

The switching device 20 is a semiconductor switching device which is a measurement target of the measurement device 10, and in FIG. 1, an N-channel MOS (metal-oxide-semiconductor) field-effect transistor M1 is used as the switching device 20. In particular, examples of the transistor M1 whose current-voltage characteristic is considered to be preferably measured by use of the measurement device 10 proposed herein include power transistors (such as SiC-MOSFETs and GaN power transistors) that are supposed to be used under a high-current/high-voltage condition and of which the gradient of the current-voltage characteristic ($\Delta Id/\Delta Vds$) does not become zero even in the saturation region.

As equivalently shown in FIG. 1, between the gate and source of the transistor M1, a gate-source parasitic capacitance Cgs is present, and between the gate and drain of the transistor M1, a gate-drain parasitic capacitance Cgd is present. The input capacitance Ciss of the transistor M1 can be expressed as the sum of the gate-source parasitic capacitance Cgs and the gate-drain parasitic capacitance Cgd (Cgs+Cgd).

In the gate of the transistor M1, an inner gate resistance Rin is present, and between the drain and source of the transistor M1, a body diode D1 with a polarity as shown in FIG. 1 is present. Although a parasitic inductance is also present in the transistor M1, here, for the sake of simple illustration, it will be omitted from illustration and description.

Different voltages and currents in the switching device 20 are represented as follows. Vgs represents the gate-source voltage, Vgs(real) represents the voltage (actual gate-source voltage) applied to the gate oxide film, Vds represents the drain-source voltage, Id represents the drain current, and Ig represents the gate current. When the gate current Ig passes, a voltage (Ig×Rin) occurs across the inner gate resistance Rin; thus, Vgs≠Vgs(real). On the other hand, when no gate current Ig passes, the voltage across the inner gate resistance Rin has a zero value; thus, Vgs=Vgs(real) if the parasitic inductance is ignored.

The voltage source 11 is a means for setting the drain-source voltage Vds applied to the transistor M1. The interconnection around the voltage source 11 is, specifically, as follows. The positive terminal of the voltage source 11 is connected to the first terminal of the current source 12. The second terminal of the current source 12 is connected to the drain of the transistor M1. The source and a backgate of the transistor M1 are connected to the negative terminal (ground terminal GND) of the voltage source 11. Thus, the voltage source 11 and the current source 12 are connected in series with the switching device 20. That is, in the measurement system in FIG. 1, the voltage source 11, the current source 12, and the switching device 20 form a closed circuit.

Figure 2:
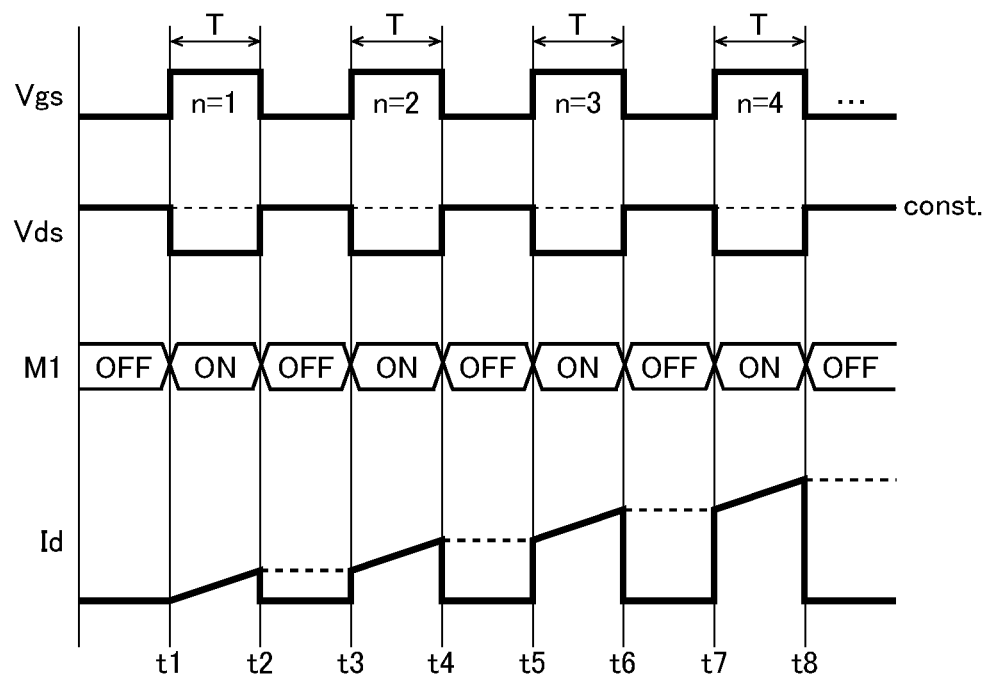
FIG. 2 is a timing chart showing an example of step setting in a drain current.

The current source 12 is a means for setting the current value of the drain current Id that passes during the ON period of the transistor M1. In the example in FIG. 1, as the current source 12, a coil 12a (one example of an inductive load) is used. With such a configuration, as shown in FIG. 2, once the pulse width T and the pulse count n of the gate-source voltage Vgs (corresponding respectively to the period and the number of times that the transistor M1 turns ON) are appropriately set, simply by turning the transistor M1 ON and OFF periodically, it is possible, while keeping the drain-source voltage Vds applied to the transistor M1 constant, to switch stepwise the current value of the drain current Id ((Vds/L)×T×n, where L represents the inductance value of the coil 12a) during switching.

The measurement device 10 adopts a measurement method in which the gate-source voltage Vgs and the gate current Ig of the transistor M1 in a switching transient state are measured at least either when the transistor M1 turns ON (see time points t1, t3, t5, and t7 in FIG. 2) or when the transistor M1 turns OFF (see time points t2, t4, t6, and t8 in FIG. 2) so that the Id-Vds characteristic of the transistor M1 is acquired based on the results of the measurement. The details will be described later.

Back in FIG. 1, the components that form the measurement device 10 will be described further.

The diode 13 is a rectifying device connected in parallel with, and in the reverse direction with respect to, the current source 12 (coil 12a) (a so-called flywheel diode). The interconnection around the diode 13 is, specifically, as follows. The cathode of the diode 13 is connected to the first terminal of the current source 12 (the positive terminal of the voltage source 11). The anode of the diode 13 is connected to the second terminal of the current source 12 (the drain of the transistor M1). By providing such a diode 13, it is possible to regenerate the current that passes through the coil 12a along a path via the diode 13 during the OFF period of the transistor M1. Thus, it is possible to prevent an excessive surge voltage from being applied to the transistor M1 and to prevent the transistor M1 from being destroyed.

The controller 14 turns the transistor M1 ON and OFF by applying a pulse voltage as the gate-source voltage Vgs of the transistor M1.

Although not illustrated in FIG. 1, the measurement device 10 includes voltmeters and ammeters for measuring the gate-source voltage Vgs, the drain-source voltage Vds, the drain current Id, and the gate current Ig of the transistor M1, and by observing the transistor M1 in the switching transient state at least either when the transistor M1 turns ON or when the transistor M1 turns OFF, acquires the Id-Vds characteristic of the transistor M1. This novel measurement method will now be described in detail.

Figure 3:
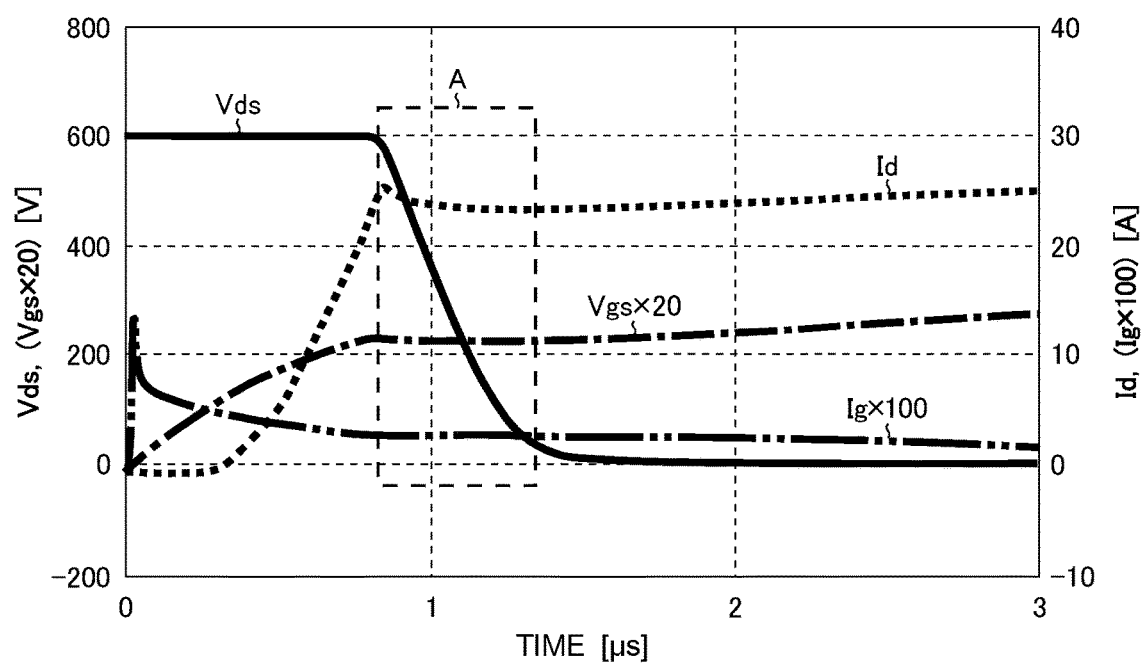
FIG. 3 is a switching waveform diagram showing a turn-ON transient characteristic.
Figure 4:
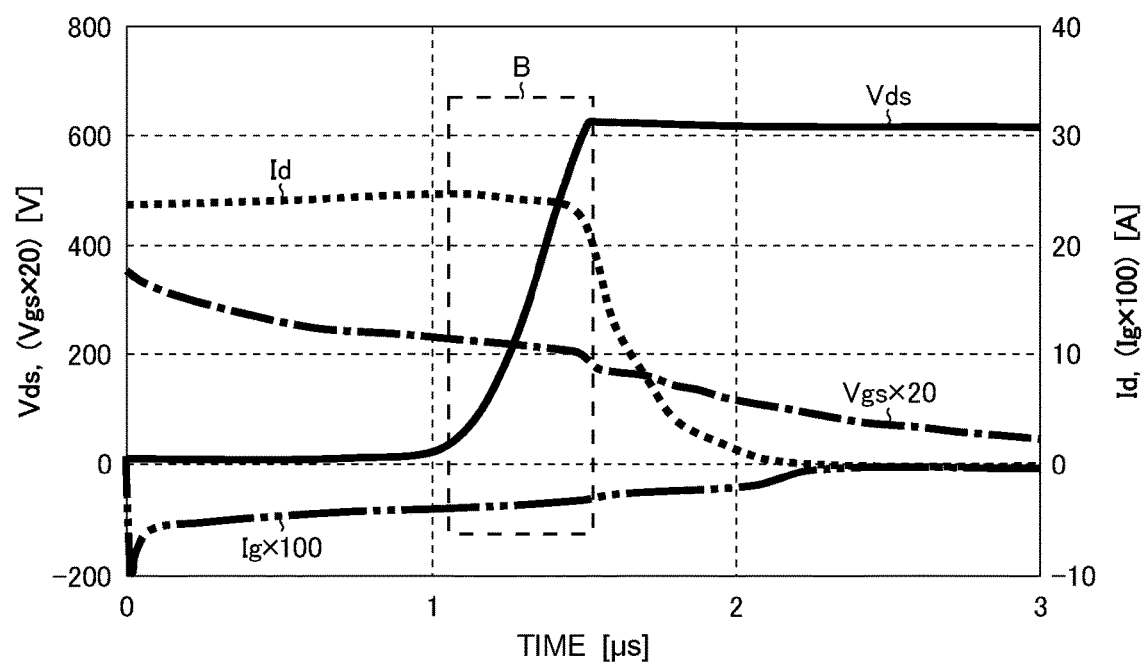
FIG. 4 is a switching waveform diagram showing a turn-OFF transient characteristic.

Switching Transient Characteristic: FIGS. 3 and 4 are switching waveform diagrams showing the turn-ON transient characteristic and the turn-OFF transient characteristic of the switching device 20 respectively. In FIGS. 3 and 4, the solid line represents the drain-source voltage Vds, the dot line represents the drain current Id, the dash-dot line represents the gate-source voltage Vgs(×20), and the dash-dot-dot line represents the current Ig(×100). The scale of the horizontal axis is 1 μs/div. The scale of the left vertical axis is 200 V/div, and the scale of the right vertical axis is 10 A/div. FIG. 3 corresponds to an enlarged view around one of time points t1, t3, t5, and t7 in FIG. 2, and FIG. 4 corresponds to an enlarged view around one of time points t2, t4, t6, and t8 in FIG. 2.

Here, after setting the drain current Id (25 A in FIGS. 3 and 4) that passes during the ON period of the transistor M1 and the drain-source voltage Vds (600 V in FIGS. 3 and 4) that is applied to the transistor M1, the measurement device 10 measures the gate-source voltage Vgs and the gate current Ig of the transistor M1 in the switching transient state, and acquires the Id-Vds characteristic based on the results of the measurement.

The switching transient state of the transistor M1 may be understood as a state in which at least one of the drain-source voltage Vds and the drain current Id is in the process of varying, or as a state in which the gate current Ig is passing.

In the switching transient state, for example, in the turn-ON transient characteristic, when the drain current Id stops varying, the drain-source voltage Vds starts varying. Thus, a high drain-source voltage Vds and a high drain current Id are simultaneously applied to the transistor M1 momentarily. The sum of time Tsw taken for the voltage and current to vary in the switching transient state is as short as 1 μs or less; thus, this measurement method produces very little heat (Id×Vds×Tsw/2). Thus, it is possible to significantly suppress heat production as compared with a case in which a conventional measurement method is applied to the high-current/high-voltage region. Thus, even with a power device that exceeds the measurable range of a curve tracer, it is possible to measure the Id-Vds characteristic in the high-voltage/high-current region. With this measurement method, there is no need to give consideration to variation in the characteristics of the transistor M1 due to heat, and thus the Id-Vds characteristic can be acquired with high accuracy.

The gate-source voltage Vgs and the gate current Ig may be measured, when the transistor M1 is in the switching transient state, at one point, specifically at a moment when the high current and high voltage are applied. However, with attention focused on, out of the switching transient state of the transistor M1, plateau regions A and B in which the drain-source voltage Vds varies, the inventors of the present invention have found that the gate-source voltage Vgs, the gate current Ig, and the drain current Id are preferably measured in the plateau regions A and B.

The plateau regions A and B correspond to a period during which the actual gate-source voltage Vgs(real) is equal to a plateau voltage Vp. In the plateau regions A and B, while the gate-source voltage Vgs and the gate current Ig are kept constant, the drain-source voltage Vds alone varies.

In particular, the transistor M1 is switched at sufficiently low speed so that the values of the gate-source voltage Vgs and the gate current Ig measured in the plateau regions A and B remain constant (or substantially constant). Thus, in the plateau regions A and B, the gate-source voltage Vgs and the gate current Ig can be read more easily and accurately than in other regions; this makes it possible to improve measurement accuracy of the Id-Vds characteristic which is finally acquired. The switching speed of the transistor M1 can be adjusted as necessary, for example, by use of a gate resistor which is externally fitted.

To improve measurement accuracy of the Id-Vds characteristic, it is preferable that the gate-source voltage Vgs and the gate current Ig be measured a plurality of times in the plateau regions A and B and that their average values be calculated to be taken as final detection values.

As described above, with the measurement method proposed herein, the Id-Vds characteristic of the transistor M1 can be measured more accurately with less heat than with a conventional curve tracer.

When the transistor M1 is in the switching transient state, due to the gate current Ig passing, a difference corresponding to the voltage across the inner gate resistance Rin (Ig×Rin) occurs between the gate-source voltage Vgs measured by the measurement device 10 and the gate-source voltage set by the curve tracer (the gate-source voltage Vgs observed when the gate current Ig has a zero value (when Ig=zero)). Thus, even if the measurement value of the gate-source voltage Vgs is used as it is, it is difficult to accurately acquire the Id-Vds characteristic (static characteristic when the gate current Ig has a zero value).

Thus, in the measurement device 10, when the transistor M1 is in the switching transient state, the gate current Ig is measured together with the gate-source voltage Vgs, and by use of the results of the measurement, the actual gate-source voltage Vgs(real) of the transistor M1 is calculated.

Although a parasitic inductance of the conductor is present in a path through which the gate current Ig passes, considering that the gate current Ig has zero variation (is constant) in the plateau regions A and B, it does not need to be given consideration when the actual gate-source voltage Vgs(real), which is applied to the gate oxide film, is calculated.

The actual gate-source voltage Vgs(real) is equivalent to the voltage across the gate-source parasitic capacitance Cgs, and hence is equivalent to the gate-source voltage Vgs (observed when Ig=zero) set by the curve tracer. Thus, by use of, instead of the measurement value of the gate-source voltage Vgs as it is, the calculated value of the actual gate-source voltage Vgs(real), the Id-Vds characteristic can be acquired accurately. Now, the process for calculating the actual gate-source voltage Vgs(real) will be described in detail.

Vgs(real) Calculation Process: In a case where the inner gate resistance value Rin of the transistor M1 is used, the actual gate-source voltage Vgs(real) can be calculated from the gate-source voltage Vgs and the gate current Ig that are measured either when the transistor M1 turns ON or when the transistor M1 turns OFF.

For example, in a case where the measurement result obtained when the transistor M1 turns ON is used, the actual gate-source voltage Vgs(real), which is applied to the gate oxide film of the transistor M1, can be calculated by subtracting from the gate-source voltage Vgson measured during the turn-ON period the result obtained by multiplying the gate current Igon measured likewise during the turn-ON period by the inner gate resistance value Rin of the transistor M1. This calculation process can be expressed by formula (1) below.

$$Vgs(\text{real}) = Vgson - Igon \times Rin \quad (1)$$

For another example, in a case where the measurement result obtained when the transistor M1 turns OFF is used, the actual gate-source voltage Vgs(real), which is applied to the gate oxide film of the transistor M1, can be calculated by subtracting from the gate-source voltage Vgsoff measured during the turn-OFF period, the result obtained by multiplying the gate current Igoff measured likewise during the turn-OFF period by the inner gate resistance value Rin of the transistor M1. This calculation process can be expressed by formula (2) below.

$$Vgs(\text{real}) = Vgsoff - Igoff \times Rin \quad (2)$$

On the other hand, in a case where the inner gate resistance value Rin of the transistor M1 is not used, the gate-source voltage Vgs(real) can be calculated by use of the ratios of the gate-source voltages Vgson and Vgsoff measured respectively during the turn-ON period and the turn-OFF period of the transistor M1 to the gate currents Igon and Igoff measured respectively during the turn-ON period and the turn-OFF period of the transistor M1. This calculation process can be expressed by formula (3) below.

$$Vgs(\text{real}) = \{(Vgsoff \times Igon) - (Vgson \times Igoff)\}/(Igon - Igoff) \quad (3)$$

Formula (3) above can be derived by combining together formulae (1) and (2) noted previously and then eliminating the inner gate resistance value Rin.

The inner gate resistance value Rin has frequency dependence, and thus it is difficult to know the inner gate resistance value Rin as it is during operation. Accordingly, the inner gate resistance value Rin is eliminated from the above-described calculation process so that the actual gate-source voltage Vgs(real) can be calculated only from the actual measurement value by use of the ratios of the gate currents Igon and Igoff in the plateau regions during the turn-On period and the turn-OFF period of the transistor M1 ({Igon/(Igon−Igoff)}, {Igoff/(Igon−Igoff)}); this helps improve the accuracy.

Figure 5:
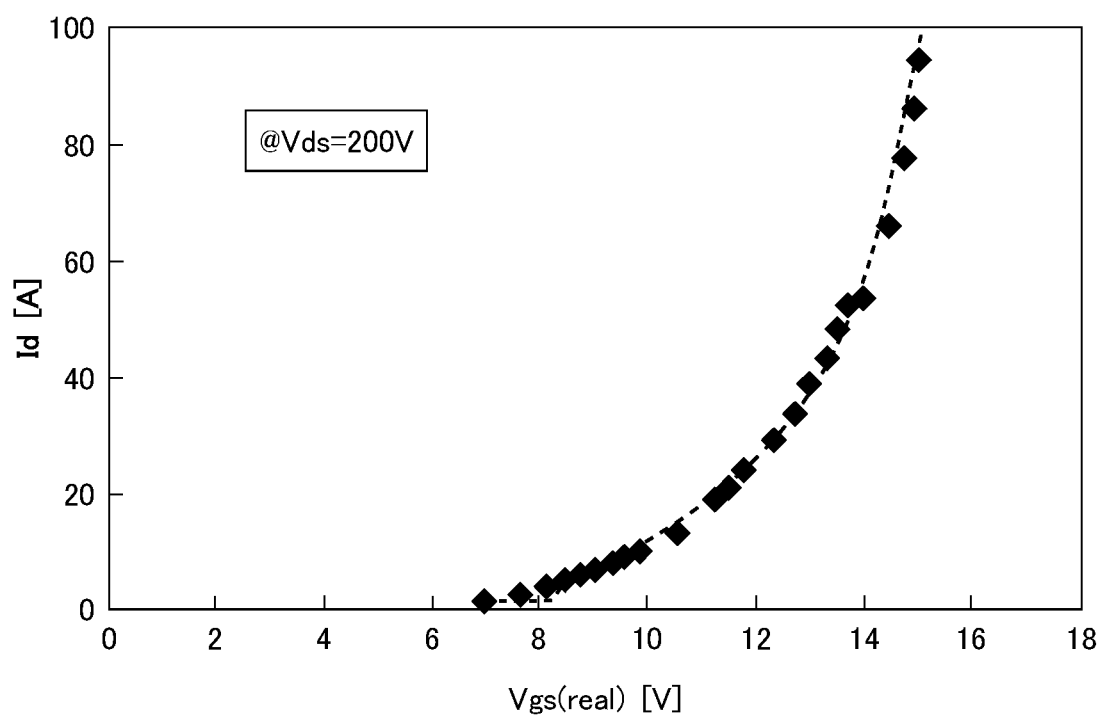
FIG. 5 is a diagram of an Id-Vgs characteristic acquired by a measurement method disclosed herein.

Vgs(real) Interpolation Process: FIG. 5 is a diagram of the Id-Vgs(real) characteristic, that is, the relationship between the drain current Id and the actual gate-source voltage Vgs(real). FIG. 5 shows the Id-Vgs(real) characteristic observed when the drain-source voltage Vds is fixed at 200V.

In the measurement device 10, the Id-Vgs(real) characteristic is derived by use of the measurement result of the drain current Id and the calculated result of the actual gate-source voltage Vgs(real). Here, the calculated values of the actual gate-source voltage Vgs(real) are discrete as indicated by rhombic symbols in FIG. 5, and do not always coincide with the voltage values set at equal intervals by use of the curve tracer.

Thus, in the measurement device 10, as indicated by the broken-line in FIG. 5, an approximation formula of the drain current Id against the actual gate-source voltage Vgs(real) is derived, and by use of it, the actual gate-source voltage Vgs(real) is interpolated. The above-mentioned approximation formula can be acquired, for example, by approximating a set of data with an order-n polynomial by the least-square method.

Through such interpolation, it is possible to correlate the drain current Id with the actual gate-source voltage Vgs (real) at equal intervals, and thus to acquire the Id-Vds characteristic which is equivalent to that by the conventional one.

Figure 6:
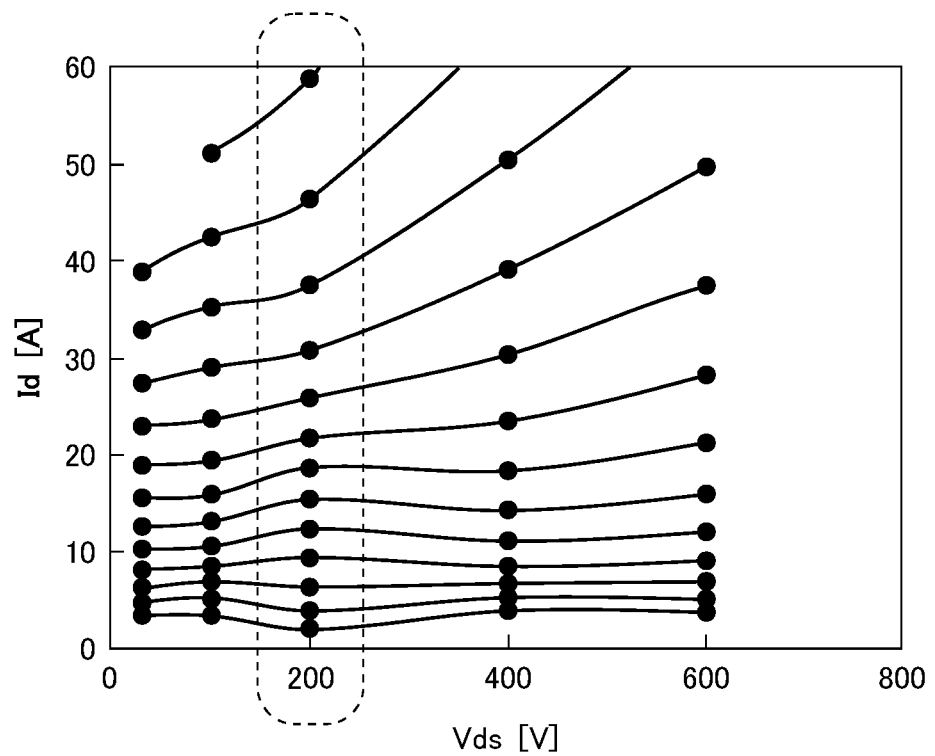
FIG. 6 is a diagram of an Id-Vds characteristic acquired by a measurement method disclosed herein.
Figure 7:
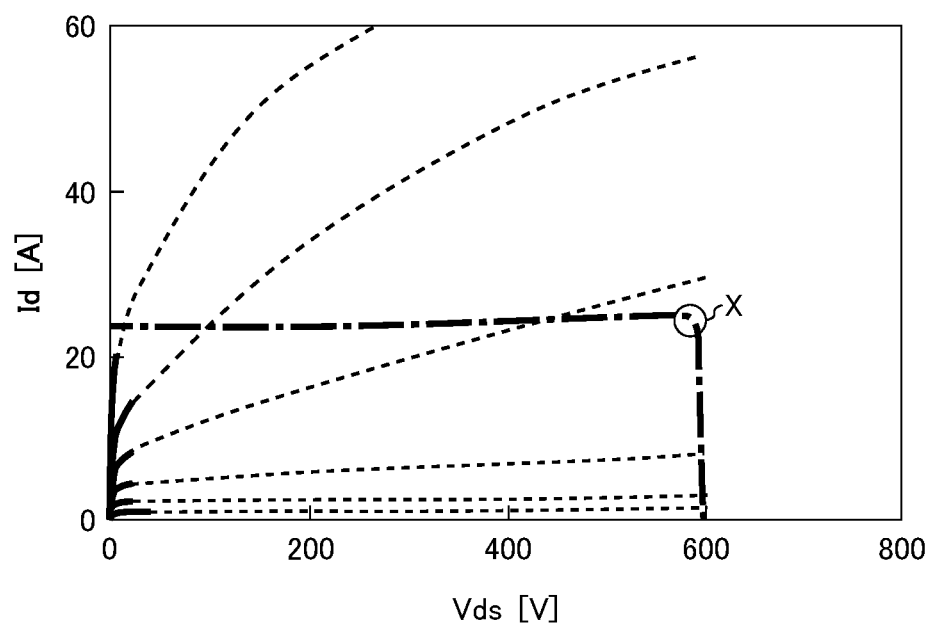
FIG. 7 is a diagram of an Id-Vds characteristic showing a measurement range of a curve tracer.
Figure 8:
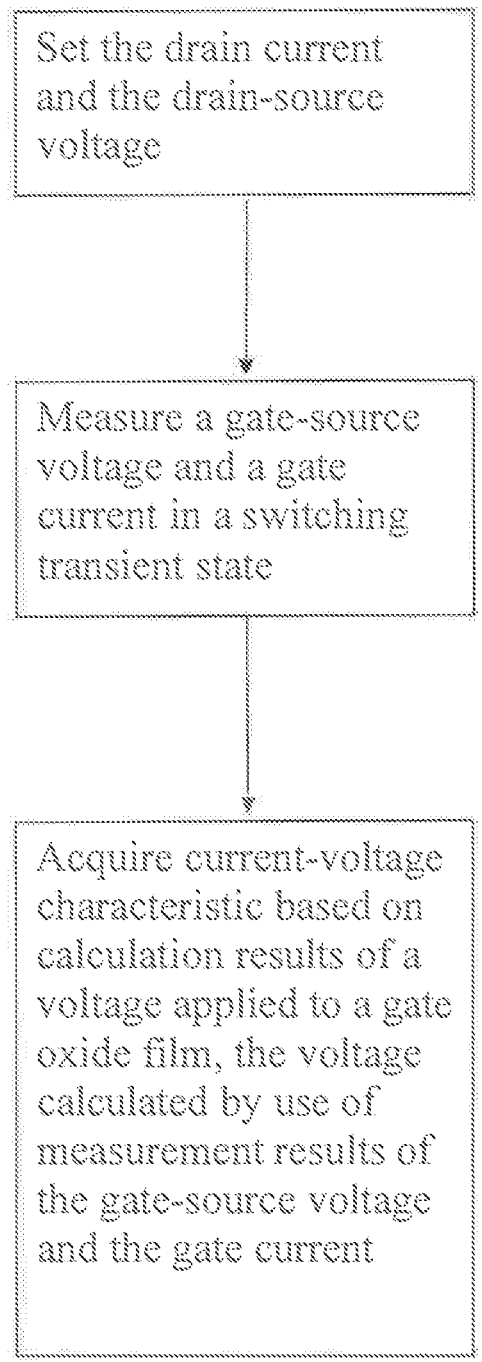
FIG. 8 is a flow chart illustrating a method for measuring a current-voltage characteristic representing a relationship between a drain current and a drain-source voltage.

FIG. 6 is a diagram of the Id-Vds characteristic of the transistor M1 as finally acquired by the measurement method which has been described. For example, the set of measurement points (solid circular symbols) surrounded by the broken-line in FIG. 6 is a renewed plot, against the gate-source voltage Vgs(real) at equal intervals, of the corresponding drain current Id based on the approximation of the Id-Vgs(real) characteristic indicated by the broken-line in FIG. 5. As shown in FIG. 6, with the measurement method proposed herein, it is possible to acquire a curve of the Id-Vds characteristic similar to that by the curve tracer.

When the device model of the transistor M1 is created, the Id-Vds characteristic measured by use of the measurement method can be parameterized and included in the equivalent circuit description of the device model. This makes it possible to reproduce the behavior of the transistor M accurately in the simulation, and thus to improve the accuracy of the simulation.

Application to IGBT (insulated-gate bipolar transistor): Although the above-described embodiment deals with an example where a MOSFET is taken as a measurement target, this is in no way meant to limit the target of which the current-voltage characteristic is measured. For example, the present invention is applicable also to the measurement of the current-voltage characteristic of an IGBT (the Ic-Vge characteristic, that is, the relationship between the collector current Ic and the gate-emitter voltage Vge of the IGBT).

In such a case, in the mentions of terminals, voltages, and currents related to the transistor M in the description above, "source" can be read as "emitter" and "collector" can be read as "drain".

Other Modifications: Various technical features disclosed herein can be implemented in any manner other than specifically described by way of embodiments above, and allow for many modifications within the spirit of the technical ingenuity involved. That is, it should be understood that the embodiments disclosed herein are in every aspect illustrative and not restrictive, and that the technical scope of the present invention is defined not by the description of embodiments given above but by the scope of the appended claims and encompasses any modification in the sense and scope equivalent to those of the claims.

Industrial Applicability: A method for measuring a current-voltage characteristic disclosed herein is applicable, for example, to the creation of device models of power transistors (such as SiC power transistors and GaN power transistors) for use in a high-current/high-voltage region.

What is claimed is:
1. A method for measuring a current-voltage characteristic representing a relationship between a drain current and a drain-source voltage of a transistor, the method comprising:
 a first data acquisition operation for setting a drain current set value as Id1 in a sub-operation of setting the drain current set value and for measuring a first gate-source voltage in a sub-operation of measuring a gate-source voltage,
 a second data acquisition operation for setting a drain current set value as Id2 in a sub-operation of setting the drain current set value and for measuring a second gate-source voltage in a sub-operation of measuring a gate-source voltage, wherein each of the first and second data acquisition operations includes:
- a sub-operation of setting a drain current set value and a drain-source voltage set value Vds1;
- a sub-operation of arranging a switching transient state wherein the drain-source voltage varies from the set value Vds1 to substantially close to 0 in turn-ON or from 0 to substantially close to the set value Vds1 in turn-OFF; and
- a sub-operation of measuring a gate-source voltage and a gate current of the transistor in a switching transient state, wherein the gate-source voltage and the gate current remain substantially constant in the switching transient state;
- wherein the current-voltage characteristic of the transistor is acquired based on calculation results of a voltage applied to a gate oxide film of the transistor in the switching transient state, wherein the voltage applied to the gate oxide film of the transistor is calculated using a multiplication of an inner gate resistance value of the transistor multiplied by the gate current in the switching transient state, and wherein a drain current at another gate-source voltage for the current-voltage characteristics is calculated using a relationship between the drain current Id1 and a voltage applied to the gate oxide film at the first gate-source voltage and another relationship between the drain current Id2 and a voltage applied to the gate oxide film at the second gate-source voltage.

2. The method of claim 1, wherein the drain current and the drain-source voltage are set by use of a voltage source and a current source connected in series with the transistor and a rectifying device connected in parallel with, and in a reverse direction with respect to, the current source.

3. The method of claim 2, wherein as the current source, an inductive load is used.

4. The method of claim 1, wherein the transistor is a semiconductor device of which a gradient of the current-voltage characteristic does not become zero even in a saturation region thereof.

5. The method of claim 1, wherein the drain current remains substantially constant in the switching transient state, and a parasitic inductance (L) contribution to the gate-source voltage by the drain current $L(dI_d/dt)$ is substantially 0 in the switching transient state.

6. The method of claim 1
wherein the voltage applied to the gate oxide film of the transistor Vgs(real) is calculated as Vgs(real)=((Vgs,off×Ig,on)−(Vgs,on×Ig,off))/(Ig,on−Ig,off), wherein Vgs,on is the gate-source voltage in turn-ON, Vgs,off is the gate-source voltage in turn-OFF, Ig,on is the gate current in turn-ON, and Ig,off is the gate current in turn-OFF.

7. The method of claim 6, wherein the drain current and the drain-source voltage are set by use of a voltage source and a current source connected in series with the transistor and a rectifying device connected in parallel with, and in a reverse direction with respect to, the current source.

8. The method of claim 7, wherein as the current source, an inductive load is used.

9. The method of claim 6, wherein the current-voltage characteristic of the transistor at the drain-source voltage is acquired using a relation between a drain current and a gate-source voltage, and a drain current at the drain-source voltage is estimated at a point where a gate-source voltage in the relation is equal to the voltage applied to the gate oxide film.

10. The method of claim 6, wherein the transistor is a semiconductor device of which a gradient of the current-voltage characteristic does not become zero even in a saturation region thereof.

11. The method of claim 6, wherein the drain current remains substantially constant in the switching transient state, and a parasitic inductance (L) contribution to the gate-source voltage by the drain current $L(dI_d/dt)$ is substantially 0 in the switching transient state.

12. The method according to claim 1, wherein the transistor is an IGBT, the drain is a collector of the IGBT, and the source is an emitter of the IGBT.

13. The method according to claim 6, wherein the transistor is an IGBT, the drain is a collector of the IGBT, and the source is an emitter of the IGBT.

14. The method according to claim 1, wherein the transistor is a GaN power transistor.

15. The method according to claim 6, wherein the transistor is a GaN power transistor.

16. The method according to claim 1, wherein the transistor is a SiC power transistor.

17. The method according to claim 6, wherein the transistor is a SiC power transistor.

18. A method for creating a device model of a transistor by parameterizing a current-voltage characteristic of the transistor measured by the method according to claim 12.

19. A method for creating a device model of a transistor by parameterizing a current-voltage characteristic of the transistor measured by the method according to claim 18.

20. A method for computer simulation of a circuit including a transistor, wherein a device model of the transistor is created by the method for creating a device model according to claim 18.

21. A method for computer simulation of a circuit including a transistor, wherein a device model of the transistor is created by the method for creating a device model according to claim 19.

* * * * *